(12) United States Patent
Tanaka et al.

(10) Patent No.: US 7,807,534 B2
(45) Date of Patent: Oct. 5, 2010

(54) METHOD FOR MANUFACTURING SEMICONDUCTOR DEVICE AND SEMICONDUCTOR DEVICE MANUFACTURED THEREFROM

(75) Inventors: Hideaki Tanaka, Yokohama (JP); Masakatsu Hoshi, Yokohama (JP); Tetsuya Hayashi, Yokosuka (JP); Shigeharu Yamagami, Yokohama (JP)

(73) Assignee: Nissan Motor Co., Ltd., Yokohama-shi, Kanagawa (JP)

( * ) Notice: Subject to any disclaimer, the term of this patent is extended or adjusted under 35 U.S.C. 154(b) by 180 days.

(21) Appl. No.: 12/033,468

(22) Filed: Feb. 19, 2008

(65) Prior Publication Data
US 2008/0203401 A1 Aug. 28, 2008

(30) Foreign Application Priority Data
Feb. 27, 2007 (JP) .............................. 2007-047396

(51) Int. Cl.
*H01L 29/76* (2006.01)
(52) U.S. Cl. ................................. 438/268; 257/E23.37
(58) Field of Classification Search ......... 257/328–334, 257/552, 554; 438/268–274, 235
See application file for complete search history.

(56) References Cited

U.S. PATENT DOCUMENTS 5,760,433 A * 6/1998 Ramer et al. ................ 257/295
6,822,272 B2 * 11/2004 Yanamoto .................... 257/189
2004/0238488 A1 * 12/2004 Choi et al. .................... 216/58
2006/0060917 A1 * 3/2006 Hayashi et al. ............. 257/330

FOREIGN PATENT DOCUMENTS

| EP | 1 519 419 A2 | 3/2005 |
| EP | 1 641 030 A2 | 3/2006 |
| JP | 2003-318398 A | 11/2003 |
| JP | 2006-100357 A | 4/2006 |

* cited by examiner

*Primary Examiner*—Matthew W Such
*Assistant Examiner*—Ali Naraghi
(74) *Attorney, Agent, or Firm*—Young Basile

(57) ABSTRACT

A method for producing a semiconductor device includes forming a first hetero-semiconductor layer as a hetero-junction to a surface of a silicon carbide epitaxial layer. This layer is composed of polycrystalline silicon having a band gap different from that of the silicon carbide epitaxial layer. An etching stopper layer composed of a material having a different etching rate from that of the polycrystalline silicon is formed on the surface of the first hetero-semiconductor layer. A second hetero-semiconductor layer composed of polycrystalline silicon is formed so that the second hetero-semiconductor layer contacts the surface of the first hetero-semiconductor layer and the etching stopper layer. The etching stopper layer is removed, the first hetero-semiconductor layer is thermally oxidized, and the thermally oxidized portion is then removed.

13 Claims, 5 Drawing Sheets

METHOD FOR MANUFACTURING SEMICONDUCTOR DEVICE AND SEMICONDUCTOR DEVICE MANUFACTURED THEREFROM

CROSS-REFERENCE TO RELATED APPLICATION

This application claims priority from Japanese Patent Application Serial No. 2007-047396, filed Feb. 27, 2007, which is incorporated herein in its entirety by reference.

TECHNICAL FIELD

The invention relates generally to methods for manufacturing a semiconductor device including a hetero-semiconductor region hetero-joined to a semiconductor substrate and to devices manufactured according to the methods.

BACKGROUND

Silicon carbide has dielectric breakdown field strength of ten times as large as that of silicon and, like silicon, silicon carbide can be subjected to thermal oxidation. Therefore, silicon carbide attracts attention as the next generation of semiconductor materials. In particular, application to power conversion elements is desirable, and power transistors with high voltage resistance and low loss that use silicon carbide as a material have recently been proposed. It is necessary to decrease on-resistance in order to decrease the loss of a power transistor, and a power transistor that can effectively decrease on-resistance is desired. Therefore, there is known a semiconductor device in which a hetero-semiconductor region composed of polycrystalline silicon and having a band gap different from that of silicon carbide is formed in contact with a predetermined region of a first main surface of a high-concentration N-type silicon carbide semiconductor substrate on which an N-type silicon carbide epitaxial layer having a lower impurity concentration than that of the silicon carbide substrate is formed from, for example, Japanese Unexamined Patent Application Publication No. 2003-318398.

In this semiconductor device, the silicon carbide epitaxial layer is hetero-joined to the hetero-semiconductor region. In addition, a gate electrode is formed, through a gate insulating film, adjacent to the hetero-junction between the silicon carbide epitaxial layer and the hetero-semiconductor region. A source electrode is formed in contact with the hetero-semiconductor region. Also, a drain electrode is formed in contact with the silicon carbide substrate, i.e., in contact with the silicon carbide semiconductor substrate. Further, the source electrode and the gate electrode are electrically insulated from each other through an interlayer insulating film. As a result, the semiconductor device functions as a field effect transistor. The barrier height of the hetero-junction between the hetero-semiconductor region and the silicon carbide epitaxial layer is changed using an electric field from the gate electrode to perform a switching operation. Therefore, the on-resistance can be decreased because of no voltage drop in the channel region. Also, when a high voltage is applied between the source electrode and the drain electrode, an electric field is terminated in an accumulation layer formed on the hetero-semiconductor region side of the hetero-junction interface, and thus breakdown does not occur in the hetero-semiconductor region, thereby securing high voltage resistance between the source electrode and the drain electrode.

BRIEF SUMMARY

Embodiments of the invention provide a method for manufacturing a semiconductor device and a resulting semiconductor device. One method comprises, for example, forming a first hetero-semiconductor layer on a first surface of a semiconductor substrate, the first hetero-semiconductor layer including a hetero-semiconductor material, forming an etching stopper layer at a predetermined position on a first surface of the first hetero-semiconductor layer opposite the semiconductor substrate, the etching stopper layer including a material having a different etching rate from that of the first hetero-semiconductor material, forming a second hetero-semiconductor layer on the first hetero-semiconductor layer and the etching stopper layer, the second hetero-semiconductor layer including a hetero-semiconductor material, removing the etching stopper layer and thermally oxidizing the first hetero-semiconductor layer.

BRIEF DESCRIPTION OF THE DRAWINGS

The description herein makes reference to the accompanying drawings wherein like reference numerals refer to like parts throughout the several views, and wherein.

DETAILED DESCRIPTION OF EMBODIMENTS OF THE INVENTION

Figure 1:
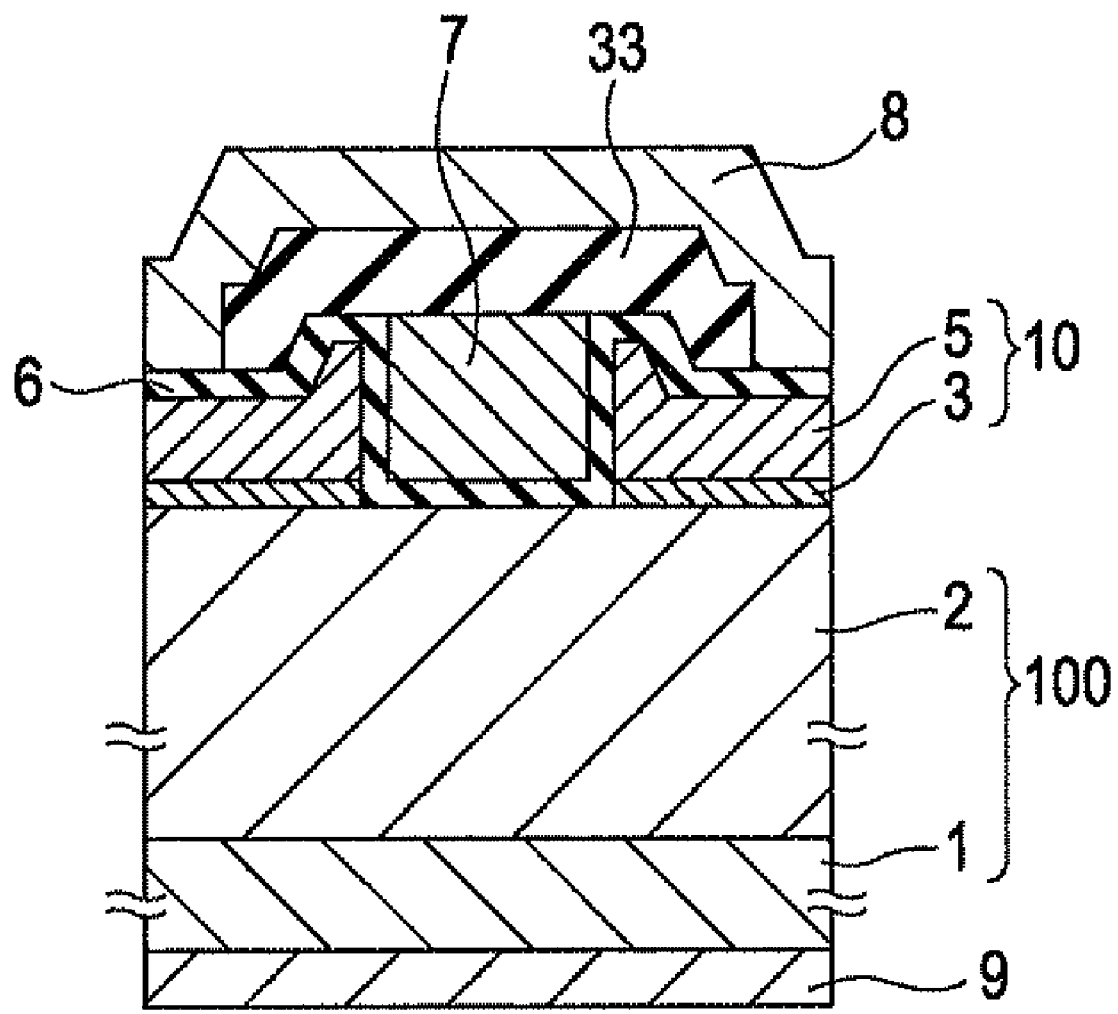
FIG. 1 is a cross-sectional view of a semiconductor device manufactured using a method according to a first embodiment of the invention.

In a conventional method for manufacturing the semiconductor device previously described, Japanese Unexamined Patent Application Publication No. 2003-318398 discloses forming a hetero semiconductor layer as a hetero semiconductor region on a silicon carbide semiconductor substrate. The hetero semiconductor layer is patterned by partially removing it until the silicon carbide semiconductor substrate is exposed to form a groove. A gate insulating film and a gate electrode are formed in the groove.

When the hetero semiconductor layer is partially removed to form the groove, wet etching is used, which causes etching damage to the hetero-junction between the hetero semiconductor layer and the silicon carbide semiconductor substrate. Further, the width of the opening of the groove is increased according to the thickness of the hetero semiconductor layer because wet etching is isotropic etching, thereby increasing the size of the semiconductor device.

In contrast, methods for manufacturing a semiconductor device according to first and second embodiments of the invention are described with reference to the drawing figures. These methods allow miniaturization of the semiconductor device.

First, a semiconductor device manufactured according to a first embodiment is described with reference to FIG. 1. In this semiconductor device, a N-type silicon carbide epitaxial layer 2 at a lower impurity concentration than that of a high-concentration N-type silicon carbide substrate 1 is formed on a first main surface of the silicon carbide substrate 1, i.e., the front surface side thereof to form a silicon carbide semiconductor substrate 100. The semiconductor device according to the first embodiment further includes an N-type hetero-semiconductor region 10 that forms a hetero-junction to the first surface of the silicon carbide semiconductor substrate 100, i.e., the front surface thereof. The hetero-semiconductor region 10 is composed of polycrystalline silicon, which is a hetero-semiconductor material having a different band gap from that of silicon carbide used as a semiconductor material of the silicon carbide semiconductor substrate 100.

The hetero-semiconductor region 10 includes an N-type first hetero-semiconductor layer 3 formed on the surface of the silicon carbide epitaxial layer 2 of the silicon carbide semiconductor substrate 100 and an N-type second hetero-semiconductor layer 5 formed on the first main surface of the first hetero-semiconductor layer 3, i.e., the front surface thereof. Namely, the first hetero-semiconductor layer 3 and the second hetero-semiconductor layer 5 are composed of polycrystalline silicon.

The semiconductor device further includes a gate insulating film 6 formed in contact with a heterojunction between the silicon carbide epitaxial layer 2 of the silicon carbide semiconductor substrate 100 and the first hetero-semiconductor layer 3 of the hetero-semiconductor region 10. A gate electrode 7 is formed in contact with the gate insulating film 6, a source electrode 8 is formed in contact with the second hetero-semiconductor layer 5 of the hetero-semiconductor region 10, and a drain electrode 9 is formed in contact with the back side of the silicon carbide substrate of the silicon carbide semiconductor substrate 100. The gate electrode 7 and the source electrode 8 are electrically insulated from each other through an interlayer insulating film 33. Although FIG. 1 shows the construction in which the second hetero-semiconductor layer 5 and the source electrode 8 are insulated from each other through the gate insulating film 6, the second hetero-semiconductor layer 5 of the hetero-semiconductor region 10 contacts the source electrode 8 in a rear portion in the direction perpendicular to the drawing. The semiconductor device functions as a field effect transistor having a vertical structure when the barrier height of the hetero-junction between the silicon carbide epitaxial layer 2 and the first hetero-semiconductor layer 3 is changed by an electric field applied from the gate electrode 7. Hereinafter, in the heterojunction between the silicon carbide epitaxial layer 2 and the first hetero-semiconductor layer 3, i.e., the hetero-junction interface, the portion in contact with the gate insulating film 6 is referred to as the "hetero-junction drive end".

Figure 2A:
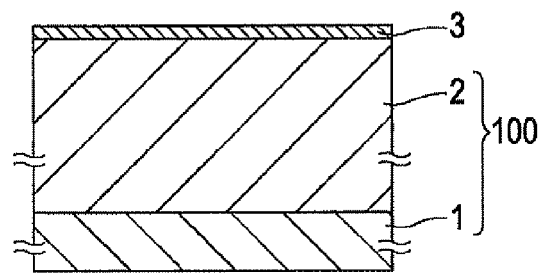
FIGS. 2A to 2K are cross-sectional views of the semiconductor device of FIG. 1 after respective steps of the method according to the first embodiment.

Next, the method for manufacturing the semiconductor device according to FIG. 1 is described with reference to FIGS. 2A to 2K. First, as shown in FIG. 2A, the silicon carbide semiconductor substrate 100 including the silicon carbide substrate 1 and the silicon carbide epitaxial layer 2 laminated on the first main surface side, i.e., the front surface side of the silicon carbide substrate 1, is prepared. Then, polycrystalline silicon, which is a hetero-semiconductor material, is deposited to, for example, 200 Å, on the surface of the silicon carbide epitaxial layer 2 of the silicon carbide semiconductor substrate 100 to form the first hetero-semiconductor layer 3.

Figure 2B:
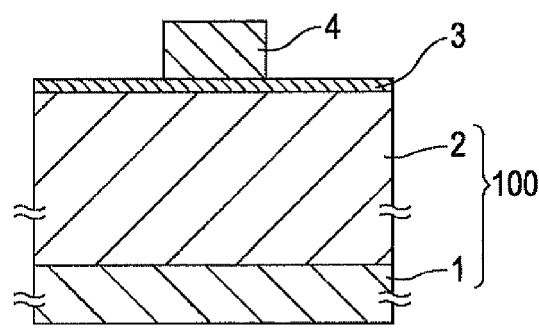
Figure 2C:
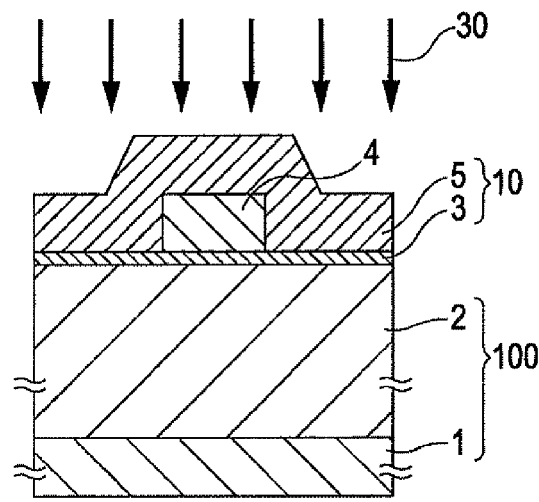

As shown in FIG. 2B, next an etching stopper layer 4 composed of silicon oxide, which is a material having a different etching rate from that of polycrystalline silicon used as a hetero-semiconductor material, is formed in a thickness of, for example, 0.1 μm. The etching stopping layer 4 is formed at a predetermined position of the first surface, i.e., the front surface, of the first hetero-semiconductor layer 3. Next, as shown in FIG. 2C, polycrystalline silicon is deposited to, for example, 0.4 μm, in contact with the first main surface, i.e., the front surface, of the first hetero-semiconductor layer 3 and the etching stopper 4. Then, arsenic ions 30 are implanted as an impurity dopant, for example, with an acceleration voltage of 70 KeV and in a dosage of $5\times10^{15}$ cm$^{-3}$ to form the N-type first hetero-semiconductor layer 3 and the N-type second hetero-semiconductor layer 5.

Figure 2D:
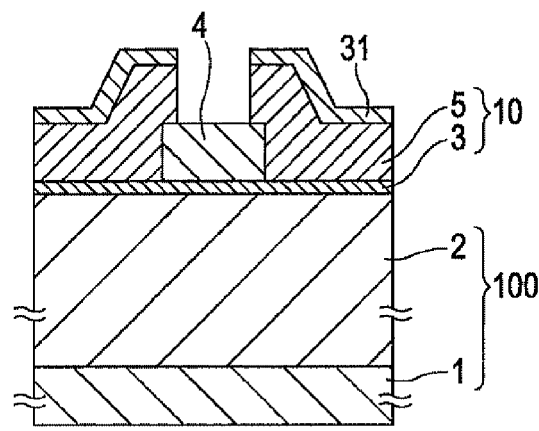

Next, as shown in FIG. 2D, in photolithography and dry etching photoresist 31 is applied on the second hetero-semiconductor layer 5, and the second hetero-semiconductor layer 5 is partially etched on the first main surface of the etching stopper layer 4, i.e., the surface opposite to the contact surface between the first and second hetero-semiconductor layers 3 and 5. In this first embodiment, an etching gas used for dry etching is selected so that the etching selection ratio of the polycrystalline silicon that constitutes the second hetero-semiconductor layer 5 is higher than that of the silicon oxide that constitutes the etching stopper layer 4. Therefore, even if an amount of over-etching is large, the etching stopper layer 4 is little etched. Namely, the second hetero-semiconductor layer 5 can be stably partially etched on the surface of the etching stopper layer 4. In addition, since the thickness of the etching stopper layer 4 is, for example, 0.1 μm, plasma damage due to dry etching does not occur in the portion of the first hetero-semiconductor layer 3 that is covered with the etching stopper layer 4.

Instead of photolithography and dry etching, SOG (Spin On Glass) may be applied, and the surface of the second hetero-semiconductor layer 5 may be planarized and then entirely etched back so as to expose the etching stopper layer 4.

Figure 2E:
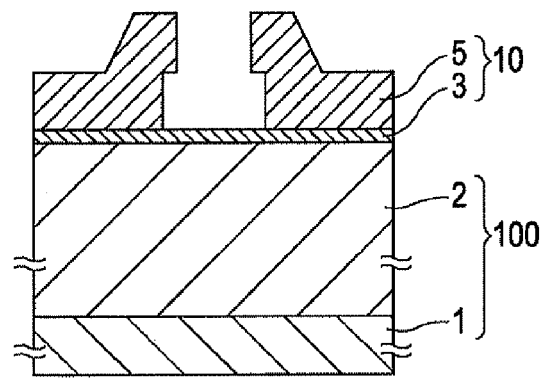

The etching stopper layer 4 composed of silicon oxide is next selectively removed by wet etching with an aqueous solution of buffered hydrofluoric acid as shown in FIG. 2E. The aqueous solution of buffered hydrofluoric acid is selected as an aqueous solution used in wet etching so that the etching selection ratio of the silicon oxide that constitutes the etching stopper layer 4 is higher than that of the polycrystalline silicon that constitutes the first and second hetero-semiconductor layers 3 and 5. Therefore, even if an amount of overetching is large, the first and second hetero-semiconductor layers 3 and 5 are little etched. In this manner, the etching stopper layer 4 can be selectively stably etched.

Figure 2F:
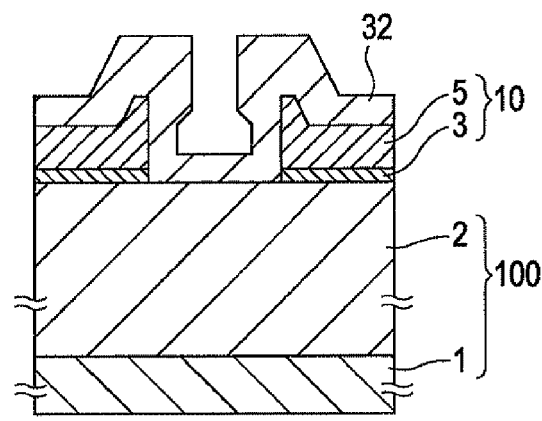

Then, as shown in FIG. 2F, the first and second hetero-semiconductor layers 3 and 5 are thermally oxidized. The thermal oxidation is performed under a condition in which the portion of the first hetero-semiconductor layer 3 covered with the etching stopper layer 4 is completely oxidized in the thickness direction. As a result, the portion of the first hetero-semiconductor layer 3 covered with the etching stopper layer 4 is completely converted to a silicon oxide layer 32, which is an oxide layer in the thickness direction. Although the conditions for thermal oxidation are determined according to the thickness of the first hetero-semiconductor layer 3, the thickness of the first hetero-semiconductor layer 3 may be determined according to the thermal oxidation conditions as long as the portion of the first hetero-semiconductor layer 3 covered with the etching stopper layer 4 can be completely oxidized by thermal oxidation in the thickness direction.

Figure 2G:
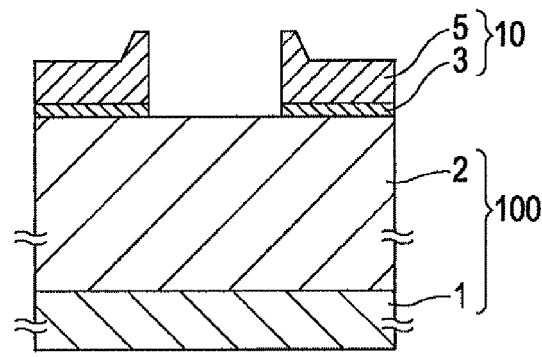

Next, as shown in FIG. 2G, the silicon oxide layer 32 is removed by wet etching with an aqueous solution of buffered hydrofluoric acid to expose the silicon carbide epitaxial layer 2.

Accordingly, this embodiment of the method includes forming the etching stopper layer 4 on the surface of the first hetero-semiconductor layer 3, forming the second hetero-semiconductor layer 5 in contact with the first hetero-semiconductor layer 3 and the etching stopper layer 4, removing the etching stopper layer 4, thermally oxidizing the portion of the first hetero-semiconductor layer 3 that is covered with the etching stopper layer 4 to convert the portion to the silicon oxide layer 32, and then removing the silicon oxide layer 32 by wet etching. By using this method, a hetero-junction drive end is formed while suppressing the occurrence of plasma damage due to dry etching in the first hetero-semiconductor layer 3 and the silicon carbide epitaxial layer 2 near the hetero-junction drive end.

Figure 2H:
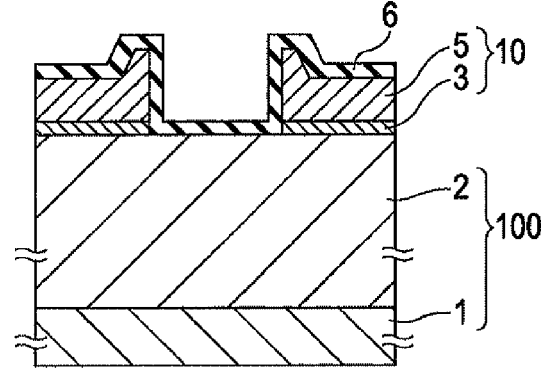
Figure 2I:
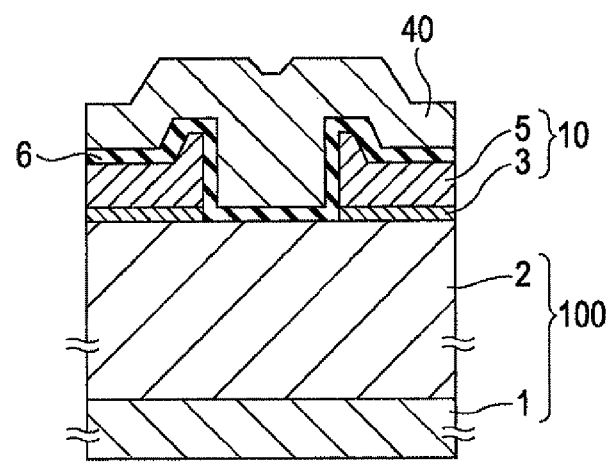
Figure 2J:
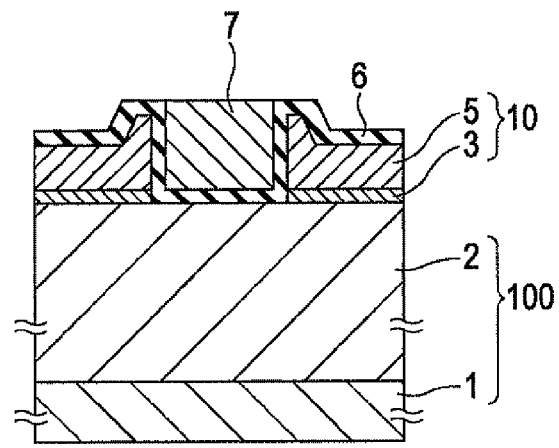

Next, as shown in FIG. 2H, the gate insulating film 6 is deposited to a thickness of, for example, 1000 Å, on the silicon carbide epitaxial layer 2 and the second hetero-semiconductor layer 5 so as to contact the hetero-junction between the silicon carbide semiconductor substrate 100 and the hetero-semiconductor region 10. Then, as shown in FIG. 2I, polycrystalline silicon is deposited to a thickness of for example, 5000 Å, to form a polycrystalline silicon layer 40 in contact with the gate insulating film 6. Next, an impurity is introduced into the polycrystalline silicon layer 40, and then the polycrystalline silicon layer 40 is patterned by photolithography and etching to form the gate electrode 7 as shown in FIG. 2J. The gate electrode 7 is adjacent to, through the gate insulating film 6, the hetero-junction between the silicon carbide semiconductor substrate 100 and the hetero-semiconductor region 10.

Figure 2K:
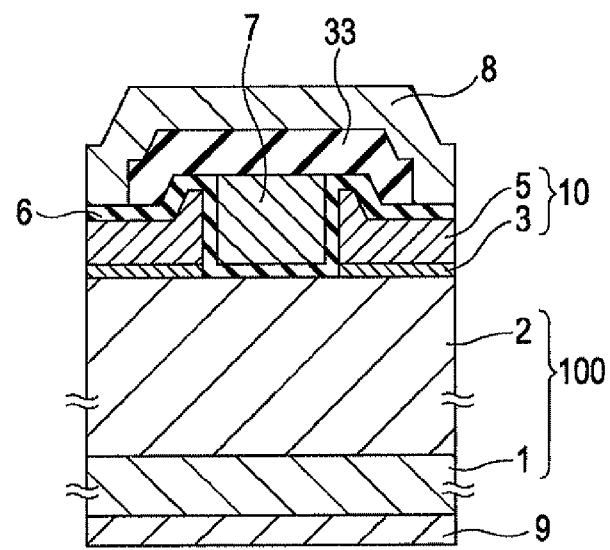

Finally, as shown in FIG. 2K, the interlayer insulating film 33 is deposited to, for example, 2 μm, on the surfaces of the gate insulating film 6 and the gate electrode 7. Then, a contact hole is formed in the interlayer insulating film 33, and aluminum is deposited to, for example, 2 μm, in contact with the hetero-semiconductor region 10 to form the source electrode 8. The source electrode 8 contacts the hetero-semiconductor region 10 in a rear portion in the direction perpendicular to the drawing. Further, titanium and aluminum are deposited to, for example, 0.1 μm and 2 μm, respectively, in contact with the back side of the silicon carbide substrate 1 to form the drain electrode 9.

The semiconductor device shown in FIG. 1 is completed by performing the above-described steps.

In the method for manufacturing a semiconductor device according to the first embodiment taught herein, dry etching need not be used. Therefore, in the hetero-junction interface between the silicon carbide epitaxial layer 2 and the first hetero-semiconductor layer 3 of the hetero-semiconductor region 10, the hetero-junction drive end can be formed while suppressing the occurrence of plasma damage due to dry etching in the first hetero-semiconductor layer 3 and the silicon carbide epitaxial layer 2 near the hetero-junction drive end that contacts the gate insulating film 6. Also, in the first embodiment the thickness of the etching stopper layer 4 is 0.1 μm, and thus even when the second hetero-semiconductor layer 5 is etched by photolithography and dry etching, plasma damage due to dry etching does not occur in the portion of the first hetero-semiconductor layer 3 that is covered with the etching stopper layer 4. Therefore, plasma damage due to dry etching can be suppressed from occurring in the first hetero-semiconductor layer 3 and the silicon carbide epitaxial layer 2 near the hetero-junction drive end. Further, when the hetero-junction drive end, which contacts the gate insulating film 6, is formed at the hetero-junction interface to which an electric field of the gate electrode 7 is applied, plasma damage can be suppressed, and a drive current can be increased. Namely, the on-resistance can be decreased as compared with a semiconductor device manufactured by conventional methods.

Unlike in a conventional method for manufacturing a semiconductor device in which the hetero-semiconductor region 10 is partially thinned, and then the thinned portion is thermally oxidized to form the hetero-junction drive end, in methods taught herein, the first hetero-semiconductor layer 3 is formed on the surface of the silicon carbide epitaxial layer 2, the etching stopper layer 4 is formed on the surface of the first hetero-semiconductor layer 3 using silicon oxide, which is a material having an etching rate different from that of the polycrystalline silicon forming the first hetero-semiconductor layer 3, the second hetero-semiconductor layer 5 is formed in contact with the first hetero-semiconductor layer 3 and the etching stopper layer 4, and the etching stopper layer is removed to expose the first hetero-semiconductor layer 3 and thin a portion of the hetero-semiconductor region 10. Therefore, etching of a portion to be thinned can be easily controlled (control of the residual thickness) by changing the thickness of the first hetero-semiconductor layer 3, and the occurrence of plasma damage due to dry etching can be securely suppressed. Similarly, only the etching stopper layer 4 can be wet-etched without etching of the first hetero-semiconductor layer 3 and the second hetero-semiconductor layer 5. The portion of the first hetero-semiconductor layer 3 that is covered with the etching stopper layer 4 can be securely exposed to securely thin a portion of the hetero-semiconductor region 10. Thus, a process capable of miniaturization with high controllability and higher yield is realized.

Further, unlike in a conventional method for manufacturing a semiconductor device in which the whole of the hetero-semiconductor region 10 is originally formed in a small thickness, and a portion of the thin hetero-semiconductor region 10 is thermally oxidized to form the hetero-junction drive end, in the first embodiment the hetero-semiconductor region 10 having a predetermined thickness or more can be formed by forming the second hetero-semiconductor layer 5 of 0.4 μm on the surface of the first hetero-semiconductor layer 3 of 200 Å, and thus source resistance can be decreased. Similarly, unlike in the conventional method for manufacturing a semiconductor device in which the whole of the hetero-semiconductor region 10 is originally formed in a small thickness, and a portion of the thin hetero-semiconductor region 10 is thermally oxidized to form the hetero-junction drive end, the hetero-semiconductor region 10 having a predetermined thickness or more can be formed, and thus arsenic ions 30 to be implanted can be prevented from passing through the hetero-semiconductor region 10 and being implanted into the silicon carbide epitaxial layer 2 in the step of forming the hetero-semiconductor region 10 by implanting the arsenic ions 30 as impurities.

Further, in the first embodiment, the etching gas is selected so that the etching selection ratio of polycrystalline silicon that constitutes the second hetero-semiconductor layer 5 is higher than that of silicon oxide that constitutes the etching stopper layer 4. Therefore, even when an amount of overetching is large, the etching stopper layer 4 is little etched, and thus the second hetero-semiconductor layer 5 on the surface of the etching stopper layer 4 can be stably etched. Also, since the etching stopper layer 4 is composed of silicon oxide, the etching stopper layer 4 can be selectively, easily and stably removed, without etching the first and second hetero-semiconductor layers 3, 5, by wet etching with an aqueous solution of buffered hydrofluoric acid that shows a higher etching selection ratio for the silicon oxide of the etching stopper layer 4 than that for the polycrystalline silicon of the first and second hetero-semiconductor layers 3, 5.

In addition, in the first embodiment, silicon carbide is used as a semiconductor material that constitutes the silicon carbide semiconductor substrate 100, and thus a semiconductor device with high voltage resistance can be realized. Further, polycrystalline silicon is used as the hetero-semiconductor material that constitutes the hetero-semiconductor region 10, and thus a process for controlling conductivity of the hetero-semiconductor region 10 can be simply performed.

Figure 3A:
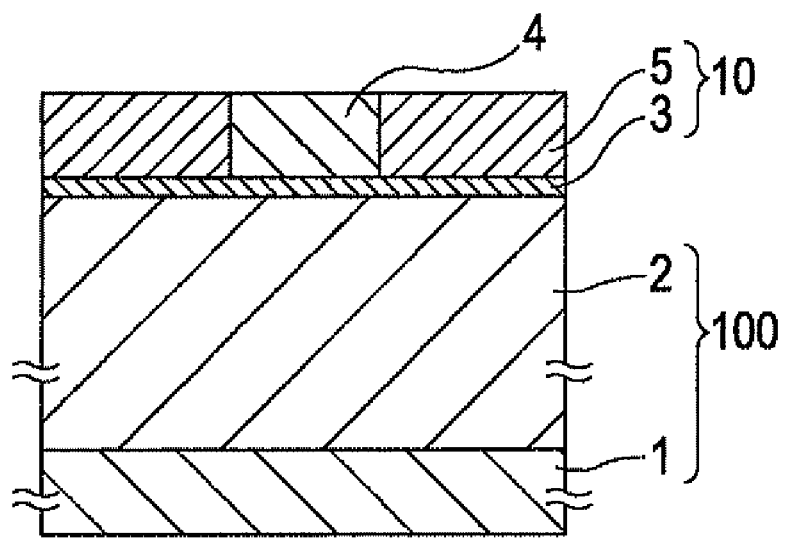
FIGS. 3A and 3B are cross-sectional views of a semiconductor device after respective steps of a method for manufacturing according to a second embodiment of the invention.
Figure 3B:
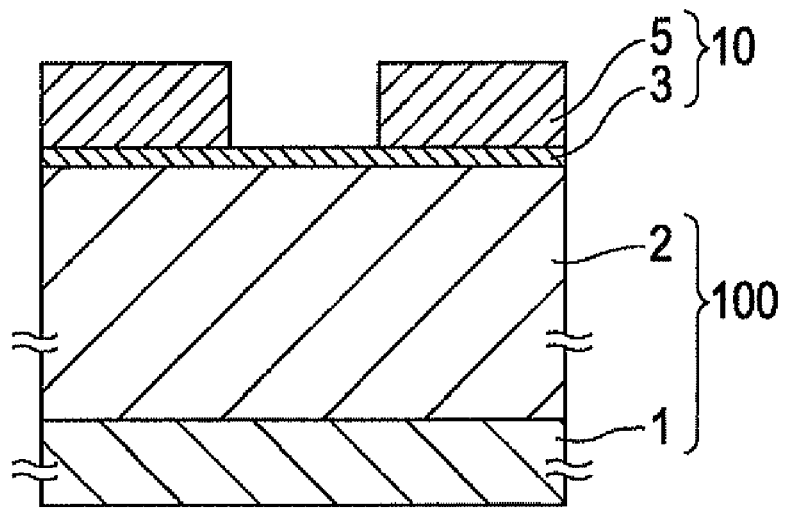

Next, a method for manufacturing a semiconductor device according to a second embodiment is described with reference to FIGS. 3A and 3B mainly with respect to differences from the method according to the first embodiment. In the semiconductor device manufactured according to the second embodiment, the same structure as in the semiconductor device manufactured according to the first embodiment is denoted by the same reference numeral, and description is omitted. The semiconductor device according to the second embodiment is different from the first embodiment only in the shape of the second hetero-semiconductor layer 5.

Unlike in the first embodiment, in the second embodiment the second hetero-semiconductor layer 5 on the surface of the etching stopper layer 4 is polished in the step of etching the second hetero-semiconductor layer 5 on the surface of the etching stopper layer 4. Specifically, as shown in FIG. 3A, the second hetero-semiconductor layer 5 on the surface of the etching stopper layer 4 is polished by CMP (Chemical Mechanical Polishing) after the step shown in FIG. 2C. Next, as shown in FIG. 3B, the etching stopper layer 4 composed of silicon oxide is selectively removed by wet etching with an aqueous solution of buffered hydrofluoric acid in the same manner as in the first embodiment. Finally, the steps shown in FIG. 2F to 2K are performed in the same manner as in the first embodiment to complete the semiconductor device of the second embodiment. As a result, the second hetero-semiconductor layer 5 can be planarized, and the same effects as in the first embodiment can be achieved.

The above-described embodiments are only examples of the invention, and the scope of the invention is not limited to these embodiments. Therefore, various embodiments can be made within the scope of the claims of the invention. For example, additional structures may be added or modifications may be made as long as the semiconductor device functions as a switch when the barrier height at the hetero-junction between the hetero-semiconductor region 10 and the silicon carbide semiconductor substrate 100 is changed by an electric field.

As one example, in the semiconductor device of each of the first and second embodiments, the drain electrode 9 and the source electrode 8 are disposed opposite to each other with the silicon carbide epitaxial layer 2 provided therebetween so that the characteristic portion is applied to a so-called vertical structure field effect transistor in which a current flows in the vertical direction. However, the drain electrode 9 and the source electrode 8 can be disposed on the same main surface so that the invention can be applied to a so-called horizontal structure field effect transistor in which a current flows in a transverse direction.

In addition, in the semiconductor device according to each of the first and second embodiments, the silicon carbide semiconductor substrate 100, the hetero-semiconductor region 10 and the first and second hetero-semiconductor layers 3 and 5 are N-type. However, these members are not particularly limited to this type, so P-type may be used.

Further, in the method for manufacturing the semiconductor device according to each of the first and second embodiments, silicon carbide is used as the semiconductor material that constitutes the silicon carbide semiconductor substrate 100. However, the semiconductor material is not limited to this, and gallium nitride or diamond may be used. Similarly, in the method for manufacturing the semiconductor device according to each of the first and second embodiments, polycrystalline silicon is used as the hetero-semiconductor material that constitutes the hetero-semiconductor region 10. The hetero-semiconductor material is not limited to this, however, and single crystal silicon, amorphous silicon, silicon germanium or gallium arsenide may be used alternatively or in addition thereto.

Silicon oxide is used as a material for the etching stopper layer 4 in each of the described embodiments. However, silicon nitride may be used, for example, as long as it has a different etching rate from that of polycrystalline silicon used as the hetero-semiconductor material.

In the method for manufacturing the semiconductor device according to each of the first and second embodiments, the N-type first hetero-semiconductor layer 3 and the N-type second hetero-semiconductor layer 5 are formed by ion implantation of impurities, specifically arsenic ions 30. However, various methods of introducing impurities are contemplated. For example, impurities may be introduced by a diffusion method.

As described in the first embodiment, the second hetero-semiconductor layer 5 on the surface of the etching stopper layer 4 is partially etched by photolithography and dry etching. However, the etching is not limited to this method. For example, SOG may be applied on the surface of the second hetero-semiconductor layer 5 to planarize the surface of the second hetero-semiconductor layer 5, and then the planarized entire surface may be etched back to expose the etching stopper layer 4, thereby realizing the structure shown in FIGS. 3A and 3B.

Further, in the method for manufacturing the semiconductor device according to each of the first and second embodiments, in the step of thermally oxidizing the first hetero-semiconductor layer 3 as shown in FIG. 2F, the conditions for thermal oxidation are determined according to the thickness of the first hetero-semiconductor layer 3. However, the thermal oxidation is not limited to this, and the thickness of the first hetero-semiconductor layer 3 may be determined according to the conditions of thermal oxidation as long as the portion of the first hetero-semiconductor layer 3 covered with the etching stopper layer 4 can be completely oxidized in this step in the thickness direction.

Accordingly, the above-described embodiments have been described in order to allow easy understanding of the invention and do not limit the invention. On the contrary, the invention is intended to cover various modifications and equivalent arrangements included within the scope of the appended claims, which scope is to be accorded the broadest interpretation so as to encompass all such modifications and equivalent structure as is permitted under the law.

What is claimed is:

1. A method for manufacturing a semiconductor device including a semiconductor substrate, a hetero-semiconductor region that forms a hetero-junction to a first surface of the semiconductor substrate and is composed of a hetero-semiconductor material having a different band gap from that of a semiconductor material of the semiconductor substrate, a gate insulating film formed in contact with a hetero-junction between the semiconductor substrate and the hetero-semiconductor region, a gate electrode formed in contact with the gate insulating film, a source electrode formed in contact with the hetero-semiconductor region, and a drain electrode formed in contact with the semiconductor substrate, the method comprising:

forming a first hetero-semiconductor layer on the first surface of the semiconductor substrate, the first hetero-semiconductor layer including the hetero-semiconductor material;

forming an etching stopper layer at a predetermined position on a portion of a first surface of the first hetero-semiconductor layer opposite to the semiconductor substrate, the etching stopper layer including a material having a different etching rate from that of the first hetero-semiconductor material;

forming a second hetero-semiconductor layer on the exposed first surface of the first hetero-semiconductor layer and the etching stopper layer, the second hetero-semiconductor layer including a hetero-semiconductor material;

removing the etching stopper layer; and thermally oxidizing the first hetero-semiconductor layer exposed by the removal of the etching stopper layer.

2. The method according to claim 1 wherein removing the etching stopper layer comprises:

etching at least a portion of the second hetero-semiconductor layer on a first surface of the etching stopper layer until the etching stopper layer is exposed.

3. The method according to claim 2 wherein removing the etching stopper layer comprises:

forming a photoresist on a first surface of the second hetero-semiconductor layer, the photoresist having a hole positioned above the etching stopper layer; and wherein etching at least a portion of the second hetero-semiconductor layer further comprises etching the second hetero-semiconductor layer through the hole until the etching stopper layer is exposed.

4. The method according to claim 2 wherein removing the etching stopper layer comprises:

selectively removing the etching stopper layer by wet etching after etching at least the portion of the second hetero-semiconductor layer.

5. The method according to claim 1, further comprising:

polishing the second hetero-semiconductor layer until the etching stopper layer is exposed before removing the etching stopper layer.

6. The method according to claim 5 wherein removing the etching stopper layer further comprises:

selectively removing the etching stopper layer by wet etching after polishing the second hetero-semiconductor layer.

7. The method according to claim 1, further comprising, after thermally oxidizing the first hetero-semiconductor layer:

removing a portion formed by thermal oxidation of the first hetero-semiconductor layer;

forming a gate insulating film in contact with the semiconductor substrate, the first hetero-semiconductor layer, and the second hetero-semiconductor layer; and forming the gate electrode in contact with a hetero-junction between the semiconductor substrate and the first hetero-semiconductor layer through the gate insulating film.

8. The method according to claim 1, further comprising:

removing a thermally oxidized portion of the first hetero-semiconductor layer by wet etching.

9. The method according to claim 1 wherein the material of the etching stopping layer is silicon oxide or silicon nitride.

10. The method according to claim 1 wherein the first hetero-semiconductor layer is configured to be completely converted to a silicon oxide layer in response to thermally oxidizing the first hetero-semiconductor layer.

11. The method according to claim 1 wherein the hetero-semiconductor material is one of single crystal silicon, polycrystalline silicon and amorphous silicon.

12. The method according to claim 1 wherein the semiconductor material of the semiconductor substrate is one of silicon carbide, gallium nitride and diamond.

13. A method for manufacturing a semiconductor device including a semiconductor substrate, a hetero-semiconductor region that forms a hetero-junction to a first surface of the semiconductor substrate and is composed of a hetero-semiconductor material having a different band gap from that of a semiconductor material of the semiconductor substrate, a gate insulating film formed in contact with a hetero-junction between the semiconductor substrate and the hetero-semiconductor region, a gate electrode formed in contact with the gate insulating film, a source electrode formed in contact with the hetero-semiconductor region, and a drain electrode formed in contact with the semiconductor substrate, the method comprising:

forming a first hetero-semiconductor layer on the first surface of the semiconductor substrate, the first hetero-semiconductor layer including the hetero-semiconductor material;

forming an etching stopper layer at a predetermined position on a portion of a first surface of the first hetero-semiconductor layer opposite to the semiconductor substrate, the etching stopper layer including a material having a different etching rate from that of the first hetero-semiconductor material;

forming a second hetero-semiconductor layer on exposed surfaces of both the first hetero-semiconductor layer and the etching stopper layer, the second hetero-semiconductor layer including a hetero-semiconductor material;

removing the etching stopper layer by forming a photoresist on a first surface of the second hetero-semiconductor layer, the photoresist having a hole positioned above the etching stopper layer, and etching the second hetero-semiconductor layer through the hole until the etching stopper layer is exposed; and thermally oxidizing the first hetero-semiconductor layer exposed by the removal of the etching stopper layer.

* * * * *